US012084770B2

(12) United States Patent
Tu et al.

(10) Patent No.: US 12,084,770 B2
(45) Date of Patent: Sep. 10, 2024

(54) WINDOW FOR CHEMICAL VAPOR DEPOSITION SYSTEMS AND RELATED METHODS

(71) Applicant: GlobalWafers Co., Ltd., Hsinchu (TW)

(72) Inventors: Chun-Chin Tu, Zhubei (TW); Manabu Hamano, Tochigi (JP); Lunghsing Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 269 days.

(21) Appl. No.: 17/400,722

(22) Filed: Aug. 12, 2021

(65) Prior Publication Data
US 2022/0056583 A1     Feb. 24, 2022

Related U.S. Application Data

(60) Provisional application No. 62/706,452, filed on Aug. 18, 2020.

(51) Int. Cl.
*C23C 16/48* (2006.01)
*C23C 16/458* (2006.01)
*C23C 16/52* (2006.01)

(52) U.S. Cl.
CPC .......... *C23C 16/488* (2013.01); *C23C 16/458* (2013.01); *C23C 16/52* (2013.01)

(58) Field of Classification Search
CPC ........ C23C 16/45504; C23C 16/45517; C23C 16/45591; C23C 16/481; C23C 16/45585; C23C 16/482
See application file for complete search history.

(56) References Cited

U.S. PATENT DOCUMENTS

| 5,506,403 A * | 4/1996 | Yamada | H01J 31/501 |
| | | | 250/207 |
| 6,099,648 A | 8/2000 | Anderson | |
| 6,869,485 B2 | 3/2005 | Halpin | |
| 8,038,792 B2 | 10/2011 | Ohnishi | |

(Continued)

FOREIGN PATENT DOCUMENTS

| CN | 103996753 A | 8/2014 |
| CN | 106715753 A | 5/2017 |
| JP | 2015002286 A | 1/2015 |

OTHER PUBLICATIONS

International Search Report and Written Opinion Issued for PCT/US2021/045873, dated Dec. 21, 2021 (13 pages).

*Primary Examiner* — Joseph A Miller, Jr.
(74) *Attorney, Agent, or Firm* — Armstrong Teasdale LLP

(57) ABSTRACT

A system for depositing a layer on a substrate includes a processing chamber defining a gas inlet for introducing gas into the processing chamber and a gas outlet to allow the gas to exit the processing chamber. A substrate support is positioned within the processing chamber and is configured to receive a substrate. A transparent upper window includes a convex first face spaced from the substrate support to define an air gap therebetween. The upper window is positioned within the processing chamber to direct the gas from the gas inlet, through the air gap, and to the gas outlet. The first face includes a radially outer surface and a radially inner surface circumscribed within the outer surface. The outer surface has a first radius of curvature and the inner surface has a second radius of curvature that is different from the first radius of curvature.

19 Claims, 8 Drawing Sheets

(56) References Cited

U.S. PATENT DOCUMENTS

| | | |
|---|---|---|
| 8,283,262 B2 | 10/2012 | Brenniger et al. |
| 2010/0251958 A1 | 10/2010 | Ohnishi |
| 2014/0199056 A1* | 7/2014 | Chang ............... H01L 21/67115 |
| | | 392/416 |
| 2014/0224174 A1* | 8/2014 | Abedijaberi ...... H01J 37/32477 |
| | | 138/37 |
| 2014/0263268 A1 | 9/2014 | Cong et al. |
| 2016/0071749 A1 | 3/2016 | Lau et al. |

* cited by examiner

WINDOW FOR CHEMICAL VAPOR DEPOSITION SYSTEMS AND RELATED METHODS

CROSS-REFERENCE TO RELATED APPLICATION

This application claims the benefit of U.S. Provisional Patent Application No. 62/706,452, filed Aug. 18, 2020, which is incorporated herein by reference in its entirety.

FIELD

The field relates generally to the use of chemical vapor deposition systems in processing semiconductor wafers and, more specifically, to windows and to methods for controlling the uniformity of gas flow within a chemical vapor deposition process chamber.

BACKGROUND

In chemical vapor deposition (CVD) processes, including epitaxial growth processes, uniformity in the thickness of a deposited film on a substrate is dependent on, among other factors, uniformity in the flow distribution of gasses within the process chamber. As the requirements for uniformity in film thickness become more stringent, the desire for more uniform flow rate distribution of gasses in the process chamber increases.

In conventional CVD devices, a source gas is introduced into the process chamber through a gas manifold and is directed between a gap defined between an upper window of the process chamber and a substrate positioned on a substrate support. The upper windows of conventional CVD devices do not direct a uniform gas flow distribution across the substrate surface in the processing chamber.

For example, some conventional upper windows include a curved surface spanning the process chamber and facing the substrate that may be convex, dipping towards the center of the substrate. However such conventional upper windows may produce a turbulent gas flow about the substrate resulting in dips or depressions in the epitaxy deposited on the substrate.

Additionally, some conventional CVD systems attempt to minimize the depth of the dips in the epitaxy thickness profile by operating at a decreased growth rate (e.g., at a lower deposition temperature within the processing chamber and/or at a reduced gas flow rate). However, such system of operation can result in longer process times with only moderate changes in the depth of the dips in the deposited epitaxy.

Accordingly, a need exists for an upper window capable of directing a more uniform flow distribution across the surface of a substrate within the processing chamber.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect of the present disclosure is directed to a system for depositing a layer on a substrate. The system includes a processing chamber defining a gas inlet for introducing gas into the processing chamber and a gas outlet to allow the gas to exit the processing chamber. A substrate support is positioned within the processing chamber and is configured to receive a substrate. A transparent upper window includes a convex first face spaced from the substrate support to define an air gap therebetween. The upper window is positioned within the processing chamber to direct the gas from the gas inlet, through the air gap, and to the gas outlet. The first face includes a radially outer surface and a radially inner surface circumscribed within the outer surface. The outer surface has a first radius of curvature and the inner surface has a second radius of curvature that is different from the first radius of curvature.

Another aspect of the present disclosure is directed to a window for a substrate processing system. The window includes a frame for attaching the window to a processing chamber of the substrate processing system and a transparent body connected to the frame. The body extends between a convex first face and an opposed second face. The first face includes a radially outer surface and a radially inner surface circumscribed within the outer surface. The outer surface extends radially from the frame to the inner surface and the inner surface extends radially inward from the outer surface to a radial center of the window. The outer surface has a first radius of curvature and the inner surface has a second radius of curvature that is different from the first radius of curvature.

Yet another aspect of the present disclosure is directed to a method of depositing a layer on a substrate. The method includes providing a substrate on a substrate support within a processing chamber. The processing chamber includes a gas inlet and a gas outlet. The method further includes providing an upper window in the processing chamber. The upper window is transparent to enable radiant heating light to pass through the upper window. The upper window has a convex first face spaced from the substrate to define an air gap therebetween. The first face includes a radially outer surface and a radially inner surface circumscribed within the outer surface. The outer surface has a first radius of curvature and the inner surface has a second radius of curvature that is different from the first radius of curvature. The method further includes directing a gas flow through the gas inlet, into the air gap between the first face and the substrate, and to and to the gas outlet.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols used in the various drawings indicate like elements.

DETAILED DESCRIPTION

Figure 1:
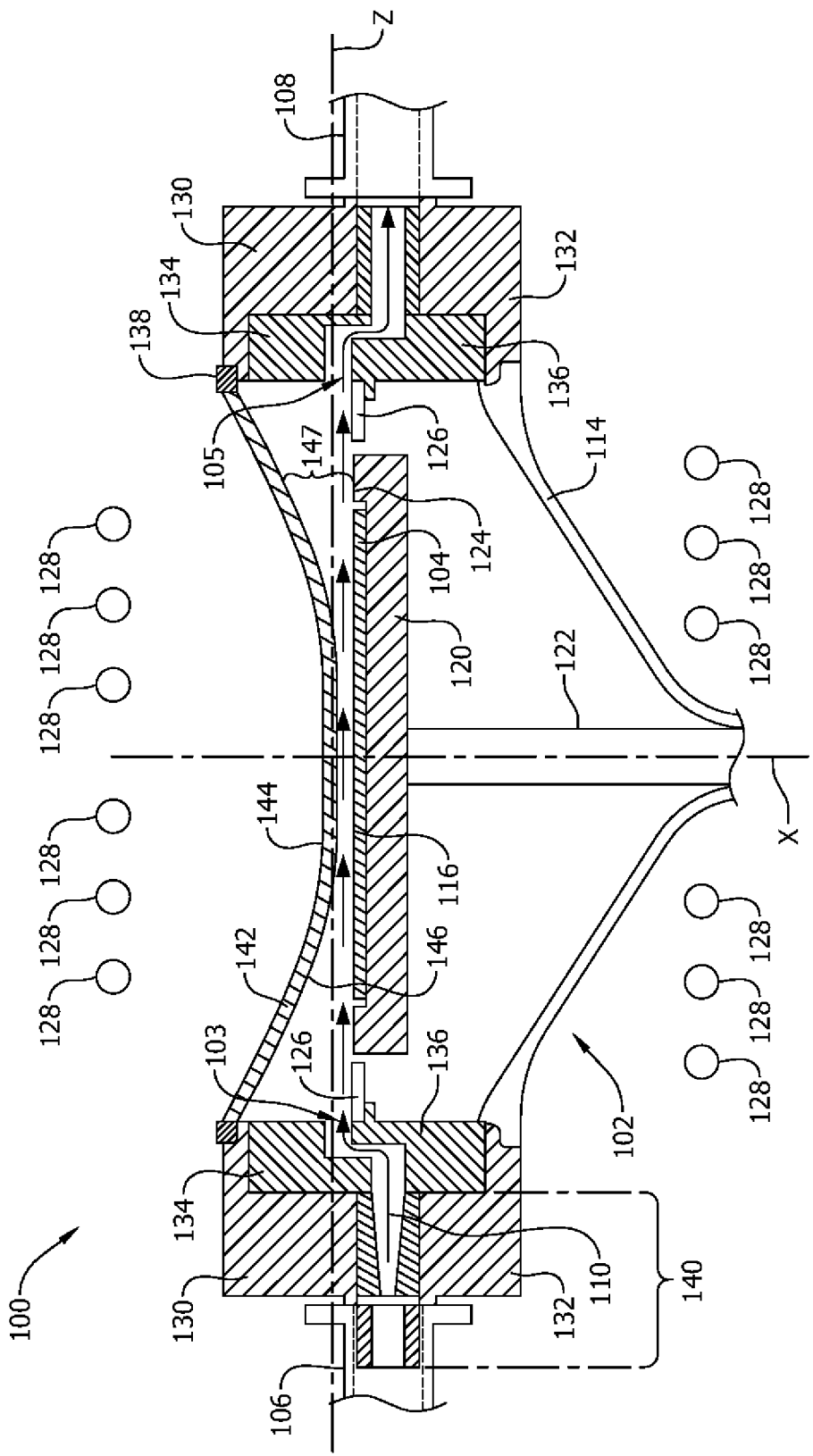
FIG. 1 is a cross-section of a chemical vapor deposition system including an upper window of one embodiment of the present disclosure.

A chemical vapor deposition (CVD) system, also referred to herein as a "substrate processing system," is indicated generally at 100 in FIG. 1. The illustrated system is a single substrate system, however, the system and methods disclosed herein for providing a more uniform gas flow distribution are suitable for use in other system designs including, for example, multiple substrate systems. One example of a CVD system suitable for use in accordance with the present disclosure is the Applied Materials EPI Centura 300.

As used herein, the term "curvature" refers to an amount by which a curve of a surface and/or a face deviates from a plane and the phrase "radius of curvature" refers to the radius of a circle and/or sphere whose perimeter has a curvature matching the curvature of the surface and/or face. For example, a surface and/or face having a relatively large curvature includes a relatively high deviation from a plane at any point along the curve and a relatively short radius of curvature. Likewise a surface or face having a relatively small curvature will have a relatively low deviation from a plane at any point along the curve and a relatively large radius of curvature.

The CVD system 100 includes a reaction or processing chamber 102 for depositing and/or growing thin films on a substrate 104 (e.g., a semiconductor wafer), a gas injection port 106 disposed at one end of the processing chamber 102, and a gas discharge port 108 disposed at an opposite end of the processing chamber 102. A gas manifold 140 disposed between the gas injecting port 106 and the processing chamber 102 is used to direct incoming gas 110 into the processing chamber 102 enclosed by an upper window 112 and a lower window 114 through the gas injection port 106. The gas manifold 140 includes an injector baffle or gas distribution plate 145 disposed between the gas injecting port 106 and the processing chamber 102, and an inject insert liner assembly 170 disposed adjacent to the baffle plate 145 and upstream from the processing chamber 102. In operation, an incoming process gas 110 flows through the gas manifold 140 and into the processing chamber 102 through gas inlet 103. The gas 110 then flows over the substrate surface 116 and reacts with the substrate surface 116, or precursors disposed thereon, to deposit a film on the substrate surface 116. The gas 110 then flows out of the processing chamber 102 and through the gas discharge port 108.

The substrate 104 upon which the film is deposited is supported by a susceptor 120 within the processing chamber 102. The susceptor 120 is connected to a shaft 122 that is connected to a motor (not shown) of a rotation mechanism (not shown) for rotation of the shaft 122, susceptor 120 and substrate 104 about a vertical axis X of the CVD system 100.

The outside edge 124 of the susceptor 120 and inside edge of a preheat ring 126 (for heating the incoming gas 110 prior to contact with the substrate 104) are separated by a gap to allow rotation of the susceptor 120. The substrate 104 is rotated to prevent an excess of material from being deposited on the wafer leading edge and provide a more uniform epitaxial layer.

Incoming gas 110 may be heated prior to contacting the substrate 104. Both the preheat ring 126 and the susceptor 120 are generally opaque to absorb radiant heating light (e.g., infrared light) produced by high intensity radiant heating lamps 128 that may be located above and below the processing chamber 102. Equipment other than high intensity lamps 128 may be used to provide heat to the processing chamber 102 such as, for example, resistance heaters and inductive heaters. Maintaining the preheat ring 126 and the susceptor 120 at a temperature above ambient allows the preheat ring 126 and the susceptor 120 to transfer heat to the incoming gas 110 as the gas 110 passes over the preheat ring 126 and the susceptor 120. The diameter of the substrate 104 may be less than the diameter of the susceptor 120 to allow the susceptor 120 to heat incoming gas 110 before it contacts the substrate 104. The preheat ring 126 and susceptor 120 may be constructed of opaque graphite coated with silicon carbide.

The upper and lower chamber walls 130, 132 define the outer perimeter of the processing chamber 102, and contact the gas injection port 106 and the gas discharge port 108.

The CVD system 100 may include upper and lower liners 134, 136 disposed within the processing chamber to prevent reactions between the gas 110 and the chamber walls 130, 132 (which are typically fabricated from metallic materials, such as stainless steel). The liners 134, 136 may be fabricated from suitably non-reactive materials, such as quartz.

The upper and lower windows 112, 114 each comprise a generally annular body 142 made of a transparent material, such as quartz, to allow radiant heating light to pass into the processing chamber 102 and onto the preheat ring 126, the susceptor 120, and the substrate 104. The windows 112, 114 may be planar, or, as shown in FIG. 1, the windows 112, 114 may have a generally dome-shaped configuration and/or inwardly concave configuration. In particular, referring to the embodiment shown in FIG. 1, the lower window 114 has a generally dome-shaped configuration and the upper window has an inwardly concave configuration. The upper and lower windows 112, 114 are each coupled or connected (terms used interchangeable herein) to the upper and lower chamber walls 130, 132 of the processing chamber 102, respectively. In particular, the upper window 112 includes a rim 138, or more broadly, a frame, attached to the upper chamber wall 130. Alternatively, the upper window 112 does not include the rim 138 and may be coupled to the upper chamber wall 130 in any manner that enables the upper window 112 to function as described herein.

The upper window 112 further includes the transparent body 142, which is attached, or optionally connected, to the rim 138 and extends between an upper concave face 144 and a lower convex face 146 of the upper window 112. The upper face 144 and the lower face 146 are each circumscribed within the rim 138. The upper face 144 is oriented to face away from the substrate 104. The lower face 146 is oriented to face the substrate 104. As shown in FIG. 1, the upper face 144 is curved substantially in correspondence with the lower face 146. Alternatively, the upper concave face 144 is shaped in any manner that enables the upper window 112 to function as described herein. For example, and without limitation, in some alternative embodiments, the upper face 144 may have a generally planar and/or dome shaped configuration.

The lower face 146 of the upper window 112 and the susceptor 120 may define a longitudinal gap, indicated generally at 147, therebetween. The gap 147 is sized to direct incoming gas 110 from the gas inlet 103, along the substrate surface 116 to the gas outlet 105, when the substrate is positioned within the susceptor. In the exemplary embodiment, the gap 147 is approximately 20 millimeters at its narrowest point. In other embodiments, the gap is any size that enables the CVD system to operate as described herein. As described in greater detail below, the lower face 146 is shaped to direct the process gas 110 over the substrate during operation of the CVD system to provide a substantially uniform vapor deposition on the substrate 104.

Figure 2:
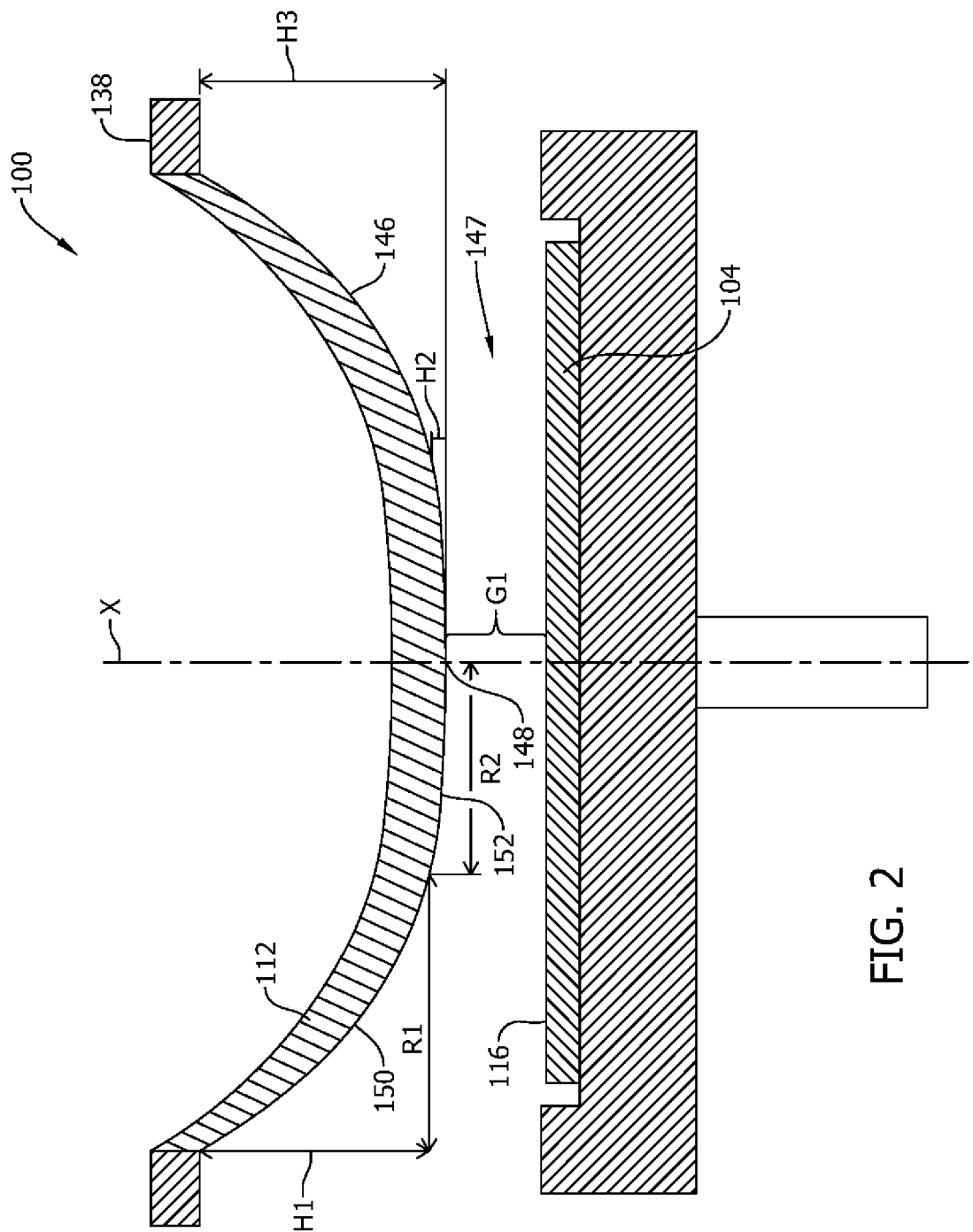
FIG. 2 is an enlarged cross-section of the chemical vapor deposition system of FIG. 1 with portions of the chemical vapor deposition system removed for purposes of illustration.
Figure 3:
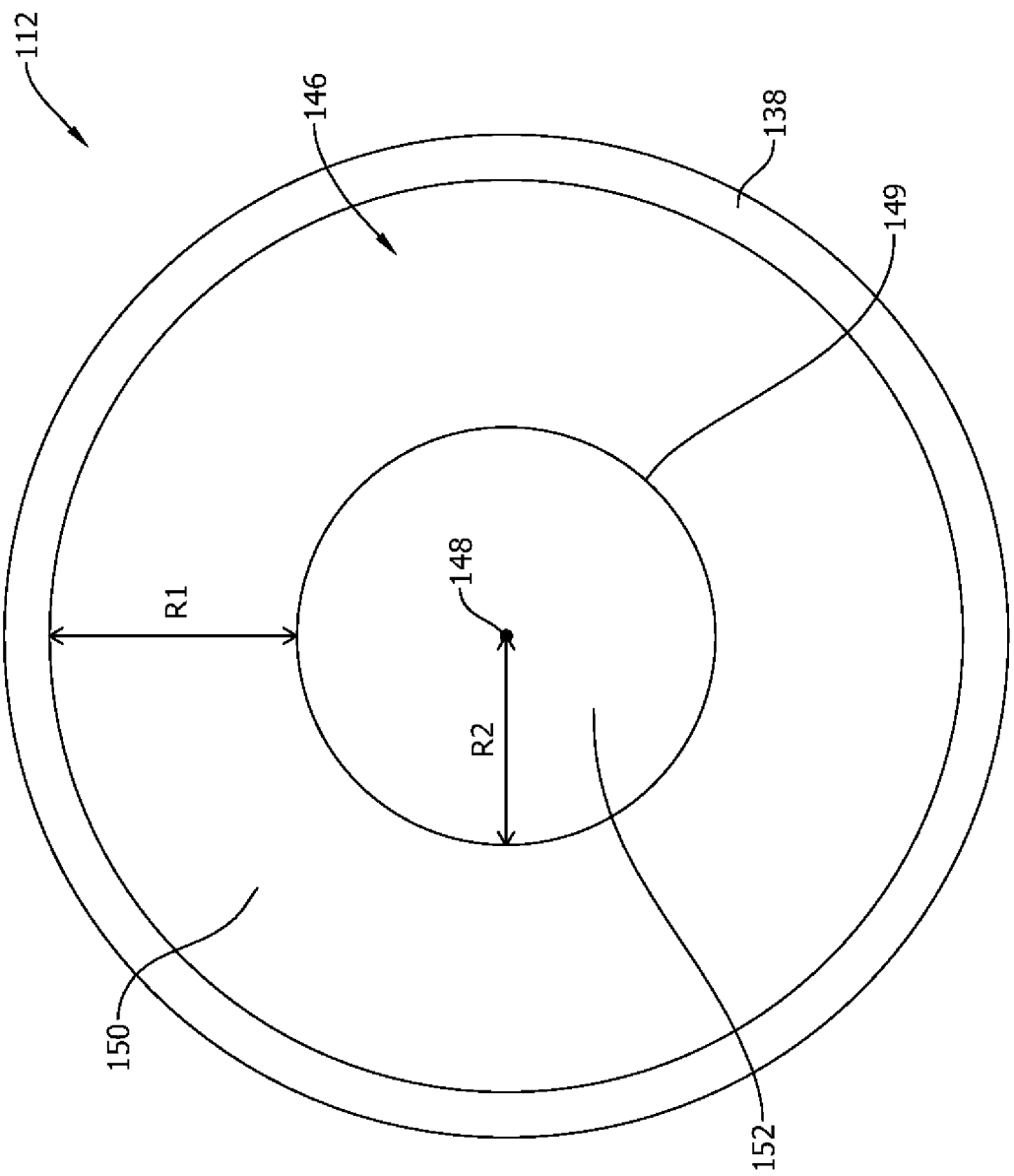
FIG. 3 is a bottom view of the upper window shown in FIG. 2.
Figure 4:
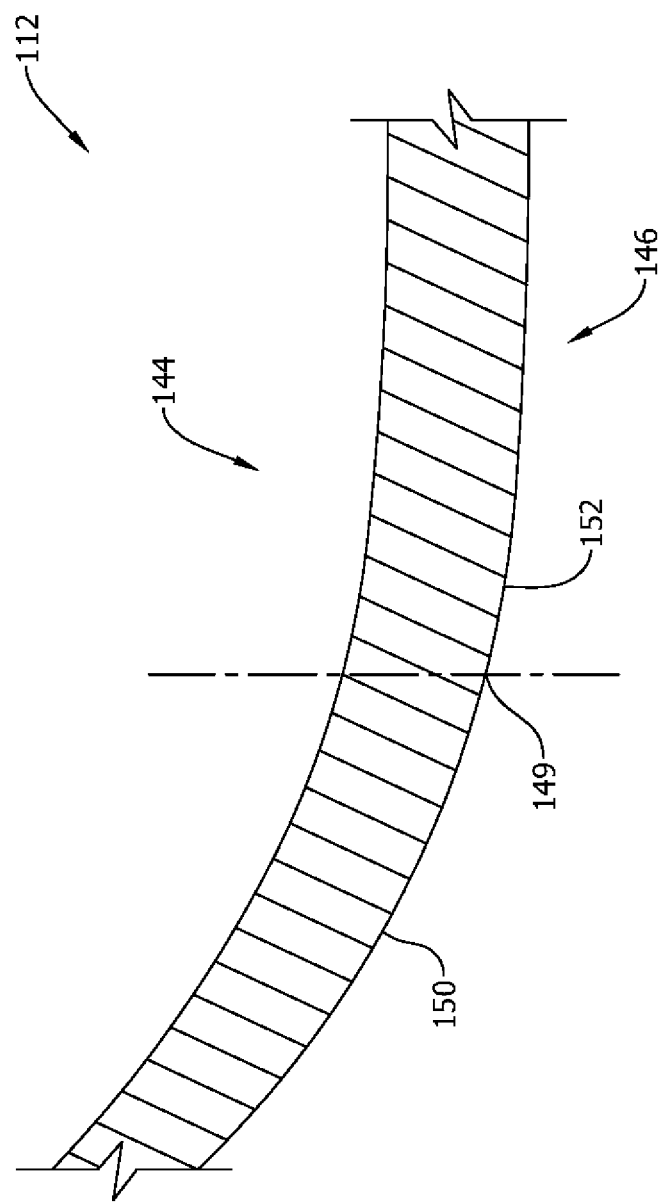
FIG. 4 is an enlarged cross-section of a portion of the upper window shown in FIG. 2.

FIG. 2 shows an enlarged view of portions of the CVD system 100 and FIG. 3 shows a bottom view of the upper window 112. FIG. 4 is an enlarged cross-section of a portion of the upper window 112 shown in FIG. 2. Referring now to FIG. 2, wherein portions of the CVD system 100 have been removed for illustration, the shape of the upper window 112 is shown in greater detail. It will be understood that the dimensions of the upper window 112 are not drawn to scale in FIG. 2 and, more particularly, that the curvatures of the upper window 112 are exaggerated for purposes of illustration.

As shown in FIG. 2, the lower face 146 defines a lowermost point, indicated generally at 148. In particular, as described herein, the lowermost point 148 of the lower face 146 is the point wherein the gap 147 defined between the lower face 146 and the substrate surface 116 is at its most narrow. For example, as shown in FIG. 2, the lowermost point 148 is spaced a gap distance, indicated at GI, from the substrate 104. As shown in FIG. 3, the lowermost point 148 of the lower face 146 is also be located at the radial center of the lower face 146, or, more generally, at the radial center of the upper window 112. Alternatively, the upper window 112 may be shaped such that the lowermost point of the upper window 112 is spaced from the radial center of the upper window 112. Moreover, as shown in FIG. 2, the lowermost point 148 may be vertically aligned with a radial center of the substrate 104.

The lower face 146 of the upper window 112 includes a radially outer surface 150 and a radially inner surface 152 circumscribed within the outer surface 150. More specifically, as shown in the embodiment of FIG. 2, the outer surface 150 extends a first radial distance, indicated at $R_1$, radially inward from the rim 138 to the inner surface 152. The outer surface 150 is curved such that the outer surface also extends a height, indicated generally at $H_1$, from the rim 138 to the inner surface 152. More specifically, in the example embodiment, the outer surface 150 of the lower face 146 has a constant curvature between the rim 138 and the inner surface 152. Alternatively, the outer surface 150 may include multiple surfaces having varied curvatures from one another.

The inner surface 152 of the lower face 146 extends a second radial distance in a plane tangential to the lowermost point 148 (also a "radial center" of the upper window in the example embodiment), indicated at $R_2$, between the outer surface 150 and the lowermost point 148 of the upper window 112. The radius $R_2$ of the inner surface 152 may be between 5 millimeters and 200 millimeters, between 25 millimeters and 125 millimeters, between 50 millimeters and 100 millimeters, or between 70 millimeters and 90 millimeters. In the embodiment of FIG. 2, the radius $R_2$ of the inner surface 152 is approximately 75 millimeters. The inner surface 152 may also be curved such that the inner surface 152 also extends a height, indicated at $H_2$ between the outer surface 150 and the lowermost point 148 (i.e., the radial center) of the upper window 112. As shown in the embodiment of FIG. 2, the inner surface 152 has a constant curvature from the outer surface 150 to the lowermost point 148 and from the lowermost point 148 to a diametrically opposed portion of the outer surface 150. Alternatively, the inner surface 152 may include multiple surfaces having varied curvatures from one another.

The lower face 146 extends an overall height, indicated at $H_3$ from the rim 138 to the lowermost point 148. More specifically, in the embodiment shown in FIG. 2, the overall height $H_3$ is equal to the sum total of the height $H_1$ of the outer surface 150 and the height $H_2$ of the inner surface 152. The overall height $H_3$ may be between 6 millimeters and 20 millimeters, 8 millimeters and 16 millimeters, or 9 millimeters and 12 millimeters. In the embodiment of FIG. 2, the overall height $H_3$ of the lower face 146 is approximately 10 millimeters.

As shown in FIGS. 2 and 4, in the example embodiment, the outer surface 150 has a greater curvature than the inner surface 152 such that the inner surface 152 has a greater radius of curvature than the outer surface 150. As a result, as shown in FIGS. 3 and 4, the lower face 146 defines a curve boundary extending circumferentially around the lower face 146 at the intersection of the inner surface 152 and the outer surface 150. The outer surface 150 may have a radius of curvature that is at least double the radius of curvature of the inner surface 152. The radius of curvature of the outer surface 150 is suitably between 700 millimeters and 1,500 millimeters, between 800 and 1,400 millimeters, or between 900 millimeters and 1300 millimeters. In the embodiment shown in FIG. 2, the radius of curvature of the outer surface 150 is 1,260 millimeters. The radius of curvature of the inner surface 152 is suitably between 3,000 millimeters and 13,000 millimeters, between 6,000 millimeters and 10,000 millimeters, or between 7,000 millimeters and 9,000 millimeters. In the embodiment shown in FIG. 2, the radius of curvature of the inner surface 152 is 8,000 millimeters. A ratio of the radius of curvature of the inner surface 152 to the radius of curvature of the outer surface 150 is suitably between 100:1 and 1.1:1, between 20:1 and 2:1, between 13:1 and 4:1, or between 10:1 and 5:1. In the embodiment shown in FIG. 2, the ratio of the radius of curvature of the inner surface 152 to the radius of curvature of the outer surface 150 is about 6:1.

Upper window 112 is suitably sized such that at least a portion of the outer surface 150 and at least a portion of the inner surface 152 vertically cover (i.e., are vertically aligned with) the substrate surface 116. In particular, a ratio of the radius of the substrate 104 to the radius $R_2$ of the inner surface 152 may be between 4:1 and 0.5:1, between 3:1 and 1:1, or between 2.5:1 and 1.5:1. In the embodiment shown in FIG. 2, a ratio of the radius of the substrate 104 to the radius $R_2$ of the inner surface 152 is approximately 2:1. More specifically, the radius $R_2$ of the inner surface 152 is approximately 75 millimeters and the radius of the substrate 104 is approximately 150 millimeters. In one alternative embodiment, the radius $R_2$ of the inner surface 152 is approximately 100 millimeters the radius of the substrate 104 is approximately 150 millimeters. In alternative embodiments, the upper window 112 may be sized such that the outer surface 150 is radially spaced from the substrate 104 and only the inner surface 152 vertically covers the substrate surface 116.

In operation, the gas 110 is introduced into the CVD system 100 from the gas injecting port at a selected flow rate. The gas may then flow into the air gap 147 defined between the lower face 146 and the susceptor 120 and/or the substrate 104. More specifically, at least a portion of the gas may flow along the outer surface 150 of the lower face 146 and to the inner surface 152. The gas 110 may then flow into a narrower portion of the gap 147 between the inner surface and the substrate 104. At least in part due to the configuration of the outer surface 150 and the inner surface 152, the gap 147 may be narrow at a center of the substrate 104 while the curvature of the inner surface 152 may be relatively small (i.e., the radius of curvature of the inner surface 152 may be relatively large) compared to at least some conventional upper windows. The narrow gap 147 at the center of the substrate in combination with the relatively small curvature of the upper window 112 proximate the center of the substrate 104 facilitates providing a laminar gas flow around the center of the substrate 104 and inhibits the formation of "dips" or depressions in the epitaxial deposition surrounding the center of the substrate 104.

EXAMPLES

The windows for a CVD system of the present disclosure are further illustrated by the following Examples. These Examples should not be viewed in a limiting sense.

Example 1: Thickness Profile Variation

In a first example, thickness profiles of epitaxy deposition on substrates were measured for different upper windows having different lower faces. In particular, a large curvature window, a small curvature window, and two windows having a dual curvature lower face were tested in a CVD system. More specifically, each of the windows were tested in an Applied Materials EPI Centura 300 system. The CVD system was controlled to deposit an epitaxy film on a cylindrical substrate having a diameter of 300 millimeters. In particular, the CVD system was controlled to deposit the film on the substrates at a growth rate of approximately 1.4 um/min (microns per minute) for each of the test windows. Thickness change values were measured by determining the difference between the greatest thickness and the lowest thickness over radial ranges of the substrate. For example, radial ranges of the substrate included −100 millimeters to −50 millimeters, −50 millimeters to 0 millimeters, 0 millimeters to 50 millimeters, and 50 millimeters to 100 millimeters, where the 0 millimeter position indicated the radial center of the substrate. A typical dip value for each of the tests was calculated by averaging the thickness change values for each of the substrate diameter ranges.

As shown in Table 1, provided below, the large curvature window had a lower face having a single radius of curvature of 3,556 millimeters, the small curvature window had a lower face having a single radius of curvature of 8,070 millimeters, the first dual curvature window had a lower face with an outer surface having a radius of curvature of 1,260 millimeters and an inner face having a radius of curvature of 8,000 millimeters. The second dual curvature window had a lower face with an outer surface having a radius of curvature of 910 millimeters and an inner face having a radius of curvature of 8,000 millimeters. The inner surface of the first dual curvature window had a radius of 75 millimeters and the inner surface of the second dual curvature window had a radius of 100 millimeters.

The large curvature window was positioned in the CVD system such that a gap between the large curvature window and the substrate (e.g., similar to gap 147 described above with respect to FIG. 1) was approximately 23 millimeters at its narrowest point. In other words, the distance between the lowest point of the upper window (e.g., similar to point 148 described above with respect FIGS. 2 and 3) and the substrate was approximately 23 millimeters. The first dual curvature window and the second dual curvature window were positioned in substantially the same manner as the large curvature. Due to the larger curvature outer surfaces of the dual curvature windows, the gap between the substrate and the each of the dual curvature windows was approximately 20 millimeters at their narrowest points. The small curvature window was also positioned such that the gap between the substrate and the windows was approximately 20 millimeters at its narrowest point.

TABLE 1

Epitaxy Profile Test Windows 1-4

| | Large Curvature Window | Small Curvature Window | Dual Curvature Window #1 $R_2 = 75$ mm | Dual Curvature Window #2 $R_2 = 100$ mm |
|---|---|---|---|---|
| Radius of Curvature #1 (mm) | 3,556 | 8,070 | 1,260 | 910 |
| Radius of Curvature #2 (mm) | N/A | N/A | 8,000 | 8,000 |
| Thickness Change from −100 mm to −50 mm (nm) | 61.02 | 28.84 | 43.76 | 48.41 |
| Thickness Change from −50 mm to 0 mm (nm) | 83.5 | 40.92 | 51.72 | 43.1 |
| Thickness Change from 0 mm to 50 mm (nm) | 62.51 | 49.13 | 44.69 | 37.27 |
| Thickness Change from 50 mm to 100 mm (nm) | 70.93 | 10.77 | 39.99 | 50.88 |
| Typical Dip (nm) | 69.49 | 32.415 | 45.04 | 44.915 |
| Relative Layer Thickness Variation (%) | 2.19 | 1.18 | 1.12 | 1.14 |

As shown in Table 1, provided above, the first dual curvature window and the second dual curvature window each resulted in a lower relative thickness variation (i.e., improved thickness uniformity) than both the large curvature window and the small curvature window. Moreover, the first dual curvature window and the second dual curvature window each resulted in a smaller typical dip than the large curvature window. "Relative layer thickness variation" of a deposited layer is determined by measuring the difference between the maximum layer thickness and the minimum layer thickness, and dividing this difference by the average layer thickness. The resultant value is multiplied by 100 in order to arrive at a percentage. This percentage is the "relative layer thickness variation" as disclosed herein.

Figure 5:
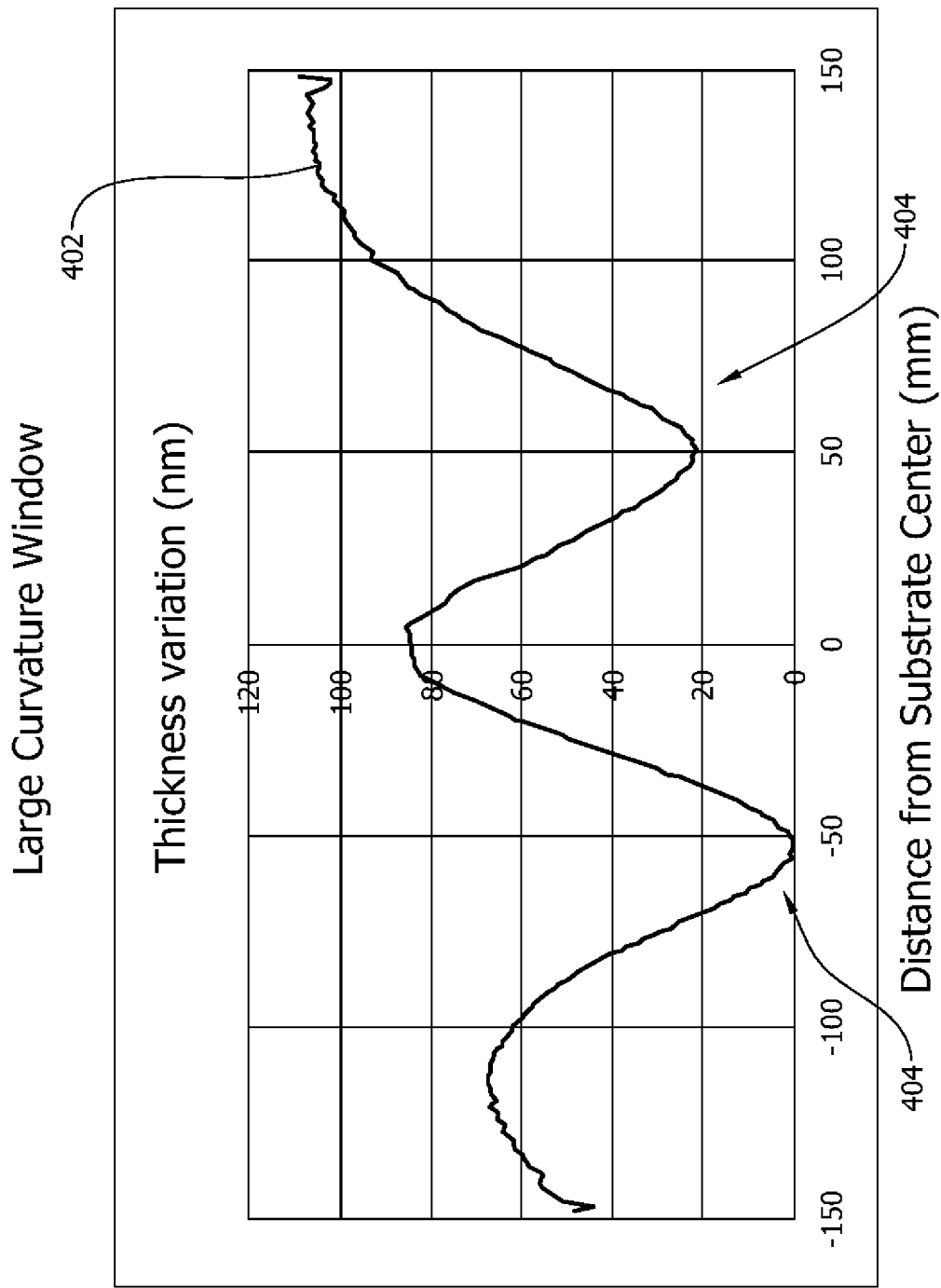
FIG. 5 is a graph showing a thickness profile of epitaxy deposited on a substrate surface in a CVD system using an upper window having a single large curvature.
Figure 6:
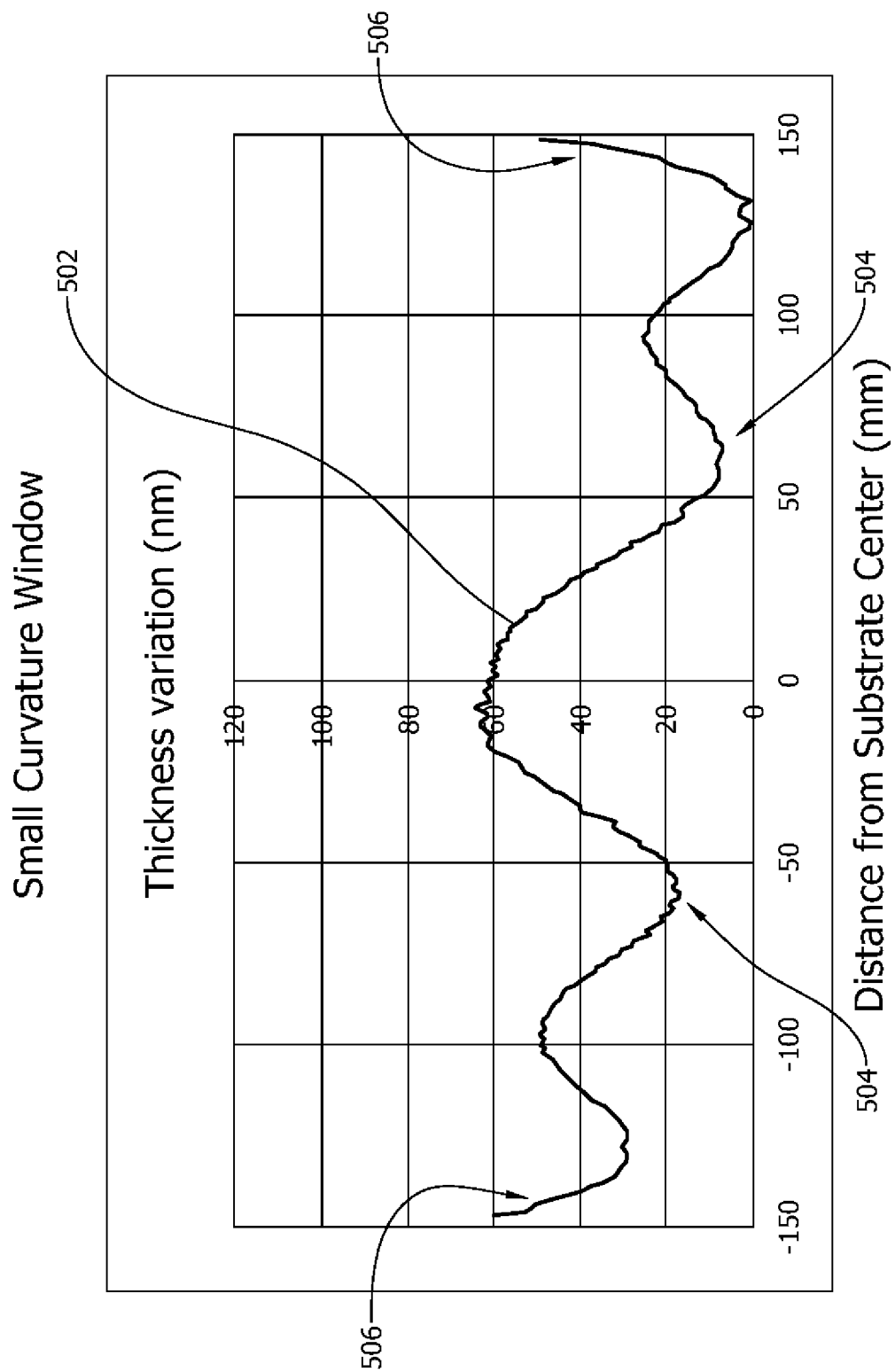
FIG. 6 is a graph showing a thickness profile of epitaxy deposited on a substrate surface in a CVD system using an upper window having a single small curvature.
Figure 7:
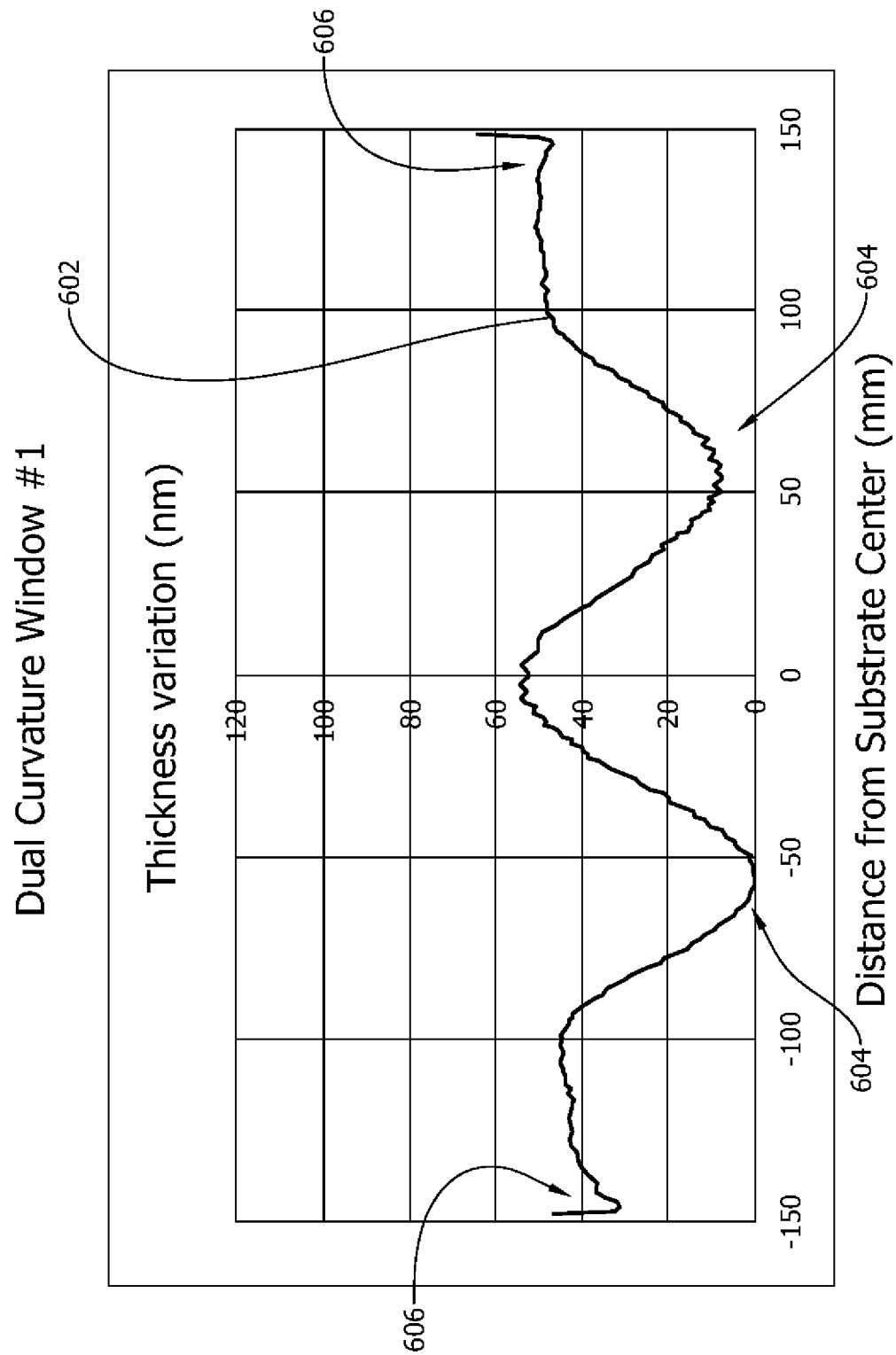
FIG. 7 is a graph showing a thickness profile of epitaxy deposited on a substrate surface in a CVD system using a first dual curvature upper window.
Figure 8:
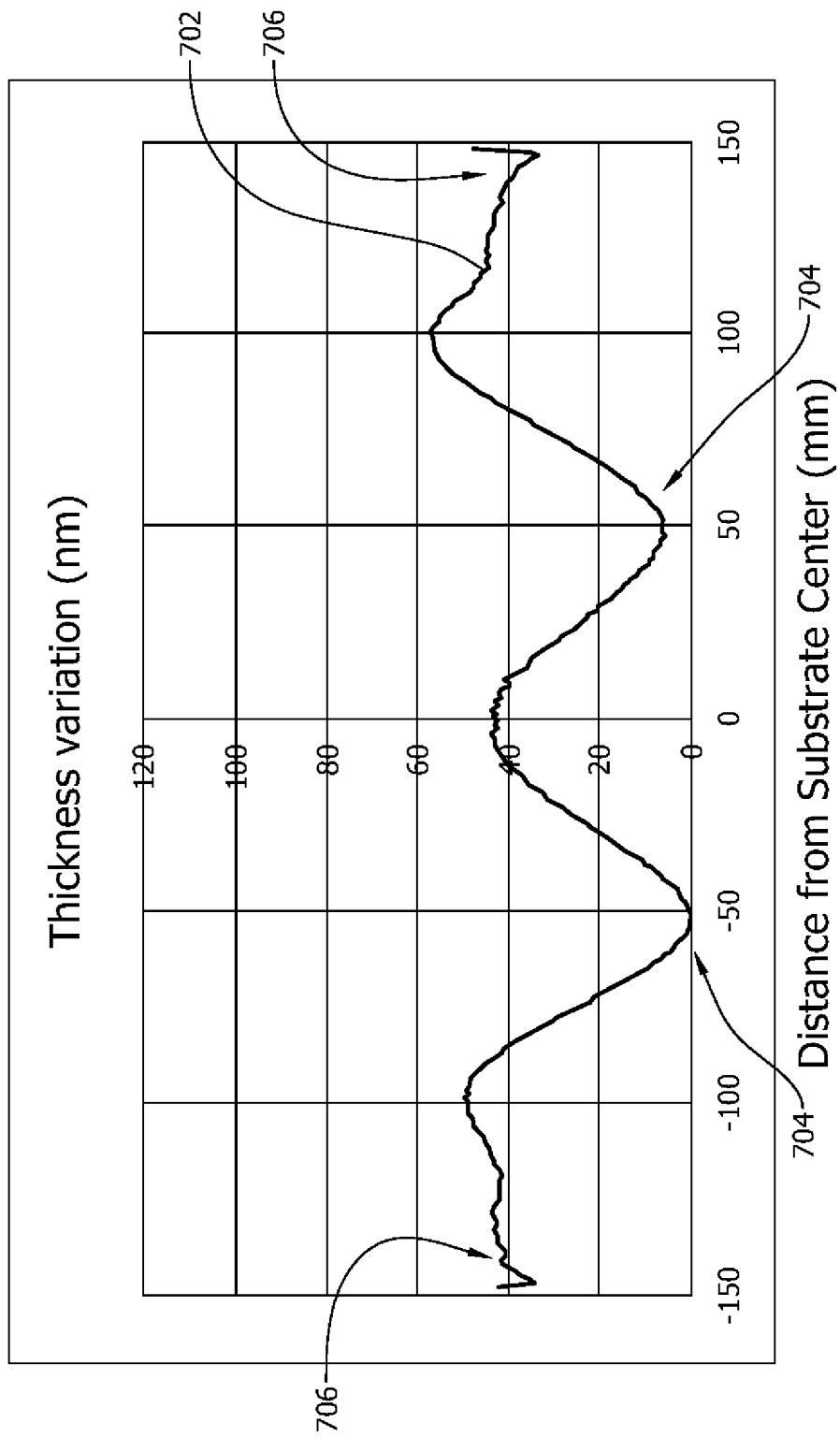
FIG. 8 is a graph showing a thickness profile of epitaxy deposited on a substrate surface in a CVD system using a second dual curvature upper window.

FIGS. 5-8 are graphs showing the measured thickness profiles of epitaxy deposited on the substrate surfaces for each of the test windows. The Y-axis in the graph represents the thickness in nanometers of epitaxy deposited on the substrate surface, with the zero adjusted to the lowest measured thickness on the substrate. The X-axis in the graph indicates the distance from the radial center of the substrate. More specifically, FIG. 5 shows the measured thickness profile 302 from the above tests, described with respect to Table 1, performed on the large curvature window. FIG. 6 shows the measured thickness profile 402 from the above tests performed on the large curvature window. FIG. 7 shows the measured thickness profile 502 from the above tests performed on the first dual curvature window, having an inner surface radius of 75 millimeters. FIG. 8 shows the measured thickness profile 602 from the above tests performed on the second dual curvature window, having an inner surface radius of 100 millimeters.

As shown in FIG. 5, the large curvature window resulted in significant dips 404 in the epitaxy thickness profile around one third of the radial distance from the center of the substrate (i.e., at +/−50 millimeters from the center of the substrate). Moreover, as shown in FIG. 6, the dips 504 around the +/−50 millimeter portion of the substrate were less pronounced with the small curvature window as compared with the large curvature window. However, the small curvature window resulted in high edge upticks 506 between the −150 millimeters to −125 millimeter range and between the 125 millimeter to 150 millimeter range on the substrate.

Referring to FIGS. 7 and 8, the epitaxy deposited on the substrates using both the first dual curvature window and the second dual curvature window had reduced dips 604, 704 around the +/−50 millimeter radius range compared with the large curvature window. Moreover, the epitaxy deposited on the substrate surfaces had reduced edge upticks 606, 706 between the −150 millimeters to −125 millimeter range and between the 125 millimeter to 150 millimeter range, as compared with the small curvature window. As a result, as shown in Table 1, provided above, the dual curvature windows each resulted in an epitaxial deposition profile that had a lower relative thickness variation compared to the large and small curvature upper windows.

Example 2: Growth Rate Comparison

In a second example, the test windows were used to measure the effects of operating the CVD system at different flow rates. For each of the tests, the temperature of the processing chamber was maintained at 1100 degrees Celsius.

In a first test, the large curvature window, the small curvature window, and the first dual curvature upper window were each tested in the CVD system and a trichlorosilane-hydrogen mixture was introduced into the CVD system at a flow rate of 8.5 standard-liters per minute. Average thickness of the epitaxy deposition and deposition time were measured to determine a growth rate in microns per minute. The results of the tests are provided in Table 2 below.

TABLE 2

Growth Rate Comparison at Flow Rate of 8.5 slm

|  | Avg. Thickness (um) | Depo. Time (sec) | Growth Rate (um/min) |
| --- | --- | --- | --- |
| Large Curvature Window | 2.442 | 102.5 | 1.435 |
| Small Curvature Window | 3.283 | 120 | 1.641 |
| Dual Curvature Window #1 | 2.64 | 102.5 | 1.551 |

As shown in Table 2, provided above, the first dual curvature window resulted in an increased growth rate relative to the large curvature window.

In a second test, the first dual curvature window and the second dual curvature window were each tested in the CVD system and a trichlorosilane-hydrogen mixture was introduced into the CVD system at a flow rate of 7.6 standard-liters per minute. Average thickness of the epitaxy deposition and deposition time were measured to determine a growth rate in microns per minute. The results of the tests are provided in Table 3 below.

TABLE 3

Growth Rate Comparison at Flow Rate of 7.6 slm

|  | Avg. Thickness (um) | Depo. Time (sec) | Growth Rate (um/min) |
| --- | --- | --- | --- |
| Dual Curvature Window #1 | 2.431 | 102.5 | 1.428 |
| Dual Curvature Window #2 | 2.519 | 102.5 | 1.481 |

As shown in Table 3, provided above, the second dual curvature window resulted in an increased growth rate relative to the first dual curvature window. Moreover, the growth rate using the first dual curvature window at a flow rate of 7.6 standard-liters per minute was about the same as the growth rate as resulted from the large curvature window operating at an increased flow rate of 8.5 standard-liters per minute measured in the first test.

In CVD systems including the upper windows described herein, the uniformity of the gas flow distribution across the substrate surface can be maintained across different gas flow rates compared with conventional CVD systems. For example, process gas, such as a trichlorosilane-hydrogen mixture, may be introduced into the CVD system at a flow rate of at least about 5 standard-liters per minute, at least about 10 standard-liters per minute, or even at least about 15 standard-liters per minute, while maintaining a relative layer thickness variation of less than about 4% across the substrate surface, less than about 2% across the substrate surface, or even less than about 1% across the substrate surface. Carrier gas, such as hydrogen, may also be introduced at a higher flow rate, such as at least about 70 standard-liters per minute, at least about 80 standard-liters per minute, or even at least about 90 standard-liters per minute, while maintaining a relative layer thickness variation of less than about 4% across the substrate surface, less than about 2% across the substrate surface, or even less than about 1% across the substrate surface. Because the uniformity of the gas flow distribution across the substrate surface can be maintained at higher gas flow rates, the rate at which a given film or layer is deposited on a substrate may also be increased while maintaining uniformity in the layer thickness. For example, an epitaxial layer may be deposited on a silicon wafer having a diameter of at least about 150 millimeters, at least about 200 millimeters, at least about 300 millimeters, while maintaining a relative layer thickness variation of less than about 4% across the diameter of the wafer, less than about 2% across the diameter of the wafer, or even less than about 1% across the diameter of the wafer.

As used herein, the term "standard-liter" refers to one liter of the referenced gas at 0° C. and 101.3 kPa (1013 millibar).

The examples described are suitable for processing semiconductor wafers, such as silicon wafers, though may be used in other applications. Some of the examples are particularly suited for use in atmospheric-pressure silicon on silicon chemical vapor deposition epitaxy using gas mixtures including hydrogen, trichlorosilane, and diborane. Silicon precursors other than trichlorosilane may also be used, including dichlorosilane, silane, trisilane, tetrachlorosilane, methylsilane, pentasilane, neopentasilane, and other higher order silane precursors. Precursors other than silicon precursors may also be used, including germane, digermane, and other germanium precursors. Dopant gas species other than diborane may be used, including phosphine and arsine. The examples described may also be used in processes other than atmospheric-pressure silicon on silicon epitaxy, including reduced-pressure epitaxy (e.g., at pressures between about 10 Torr and about 750 Torr), silicon-germanium epitaxy, carbon-doped silicon epitaxy, and non-epitaxial chemical vapor deposition. The examples may also be used to process wafers other than silicon wafers, including wafers having germanium, gallium arsenide, indium phosphide, and silicon carbide.

As described above, processing chambers including the upper windows of the present disclosure provide an improvement over known processing chambers. The upper windows of the present disclosure include two surfaces having different curvatures to direct the process flow during operation and facilitate providing a laminar flow of process gas across the substrate. As a result, uniformity in gas flow distribution across the substrate surface can be improved. More specifically, CVD systems including the upper windows of the present disclosure provide the following advantages over the some conventional CVD systems: 1) reduced epitaxial dips on the substrate; 2) reduced epitaxial upticks on the substrate near the outer perimeter of the substrate; 3) reduced processing time for epitaxial deposition on substrates; and 4) improved lifespan of semiconductor wafers.

When introducing elements of the present disclosure or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the disclosure, it is intended that all matter contained in the above description and shown in the accompanying drawings shall be interpreted as illustrative and not in a limiting sense.

What is claimed is:

1. A system for depositing a layer on a substrate, the system comprising:
    a processing chamber defining a gas inlet for introducing gas into the processing chamber and a gas outlet to allow the gas to exit the processing chamber;
    a substrate support positioned within the processing chamber and configured to receive a substrate; and
    an upper window being transparent to enable radiant heating light to pass through the upper window, the upper window having a first face spaced from the substrate support to define an air gap therebetween, the upper window positioned within the processing chamber to direct the gas from the gas inlet, through the air gap, and to the gas outlet, the first face including a radially outer surface and a radially inner surface circumscribed within the outer surface, the outer surface having a first radius of curvature and the inner surface having a second radius of curvature different from the first radius of curvature, wherein the outer surface and the inner surface are each convex; wherein the upper window includes a transparent body, the transparent body including the inner surface and the outer surface.

2. The system of claim 1, wherein the inner surface is positioned to be vertically aligned with the substrate when the substrate is received on the substrate support and wherein the second radius of curvature is greater than the first radius of curvature.

3. The system of claim 2, wherein a ratio between the second radius of curvature and the first radius of curvature is between 100:1 and 1.1:1.

4. The system of claim 3, wherein the ratio is between 10:1 and 5:1.

5. The system of claim 1, wherein the inner surface and the outer surface are each positioned to be vertically aligned with at least a portion of the substrate when the substrate is received on the substrate support.

6. The system of claim 1, wherein the upper window further includes a rim circumscribing the first face and configured to be coupled to the processing chamber, and wherein the outer surface extends from the rim to the inner surface at the first radius of curvature.

7. The system of claim 6, wherein the inner surface extends from the outer surface to a radial center of the upper window at the second radius of curvature.

8. The system of claim 7, wherein the air gap decreases between the outer surface and the inner surface.

9. The system of claim 1, wherein the inner surface defines a radius extending in a plane tangential to a radial center of the upper window, the radius extending from the radial center to the outer surface, and wherein the radius of the inner surface is between 5 millimeters and 200 millimeters.

10. The system of claim 1, wherein the upper window further includes a second face opposite the first face and a body extending between the first face and the second face, the second face having a concave curvature.

11. The system of claim 1, wherein the upper window further includes a rim circumscribing the first face and configured to be coupled to the processing chamber, wherein the outer surface extends a first height between the rim and the inner surface, wherein the inner surface extends a second height between the outer surface and a radial center of the upper window, wherein the first height is greater than the second height.

12. A chemical vapor deposition system comprising:
    a chamber wall at least partially defining a processing chamber;
    a substrate support positioned within the processing chamber, the substrate support being configured to receive a substrate thereon; and a window comprising:
a frame for attaching the window to the chamber wall; and
a transparent body connected to the frame, the body extending between a first face and an opposed second face, the first face being oriented to face toward the substrate support when the frame is attached to the chamber wall, the first face including a radially outer surface and a radially inner surface circumscribed within the outer surface, the outer surface extending radially from the frame to the inner surface and the inner surface extending radially inward from the outer surface to a radial center of the window, the outer surface having a first radius of curvature and the inner surface having a second radius of curvature different from the first radius of curvature, wherein the outer surface and the inner surface are each convex, and wherein the transparent body includes the inner surface and the outer surface.

13. The chemical vapor deposition system of claim 12, wherein the second radius of curvature is greater than the first radius of curvature.

14. The chemical vapor deposition system of claim 13, wherein a ratio between the second radius of curvature and the first radius of curvature is between 100:1 and 1.1:1.

15. The chemical vapor deposition system of claim 12, wherein the outer surface extends from the frame to the inner surface at the first radius of curvature and the inner surface extends from the outer surface to a radial center of the window at the second radius of curvature.

16. The chemical vapor deposition system of claim 12, wherein the inner surface defines a radius extending in a plane tangential to a radial center of the window, the radius extending from the radial center to the outer surface, and wherein the radius of the inner surface is between 5 millimeters and 200 millimeters.

17. The chemical vapor deposition system of claim 12, wherein the second face has a concave curvature.

18. A method of depositing a layer on a substrate, the method comprising:
providing a substrate on a substrate support within a processing chamber, the processing chamber including a gas inlet and a gas outlet;
providing an upper window in the processing chamber, the upper window being transparent to enable radiant heating light to pass through the upper window, the upper window having a first face spaced from the substrate to define an air gap therebetween, the first face including a radially outer surface and a radially inner surface circumscribed within the outer surface, the outer surface having a first radius of curvature and the inner surface having a second radius of curvature different from the first radius of curvature, wherein the outer surface and the inner surface are each convex; wherein the upper window includes a transparent body, the transparent body including the inner surface and the outer surface; and
directing a gas flow through the gas inlet, into the air gap between the first face and the substrate, and to and to the gas outlet.

19. The method of claim 18, wherein the gas flow is provided at a flow rate of greater than 2 standard-liters per minute and wherein a relative thickness variation of the deposited layer on the substrate is less than about 2 percent.

* * * * *